United States Patent
Glas et al.

(10) Patent No.: US 6,560,296 B1
(45) Date of Patent: May 6, 2003

(54) METHOD AND APPARATUS FOR MODULATING DIGITAL DATA

(75) Inventors: Jack Glas, Basking Ridge, NJ (US); Vladimir Prodanov, New Providence, NJ (US); Maurice Tarsia, Colonia, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/304,639

(22) Filed: May 4, 1999

(51) Int. Cl.[7] ............................................... H04L 27/20
(52) U.S. Cl. .................. 375/308; 375/261; 375/279; 375/298
(58) Field of Search .................. 375/261, 273, 375/279, 280, 281, 282, 283, 297, 298, 308; 332/103, 104, 144; 359/183; 370/206, 215; 455/23, 42, 60, 110

(56) References Cited

U.S. PATENT DOCUMENTS

| | | | |
|---|---|---|---|
| 4,571,549 A | 2/1986 | Lods et al. | 332/103 |
| 4,862,116 A | 8/1989 | Olver | 332/145 |
| 5,420,546 A | 5/1995 | Watanabe et al. | 331/57 |
| 5,502,745 A * | 3/1996 | Williams et al. | 375/282 |
| 5,815,531 A * | 9/1998 | Dent | 375/298 |
| 5,939,951 A * | 8/1999 | Bateman et al. | 332/103 |

OTHER PUBLICATIONS

Matsuoka H. et al., "A 5–GHZ Frequency–Doubling Quadrature Modulator With a Ring–type Local Oscillator", Melecon Conferences, May 18, 1998, IEEE BCTM 6.3, pp. 113–116.

Morais D. H. et al., "NLA–QAM: A Method for Generating High–Power QAM Signals Through Nonlinear Amplification," IEEE Transactions on Communications, vol. 30, No. 3, Mar. 1, 1982, pp. 517–522.

* cited by examiner

Primary Examiner—Stephen Chin
Assistant Examiner—Chieh M. Fan
(74) Attorney, Agent, or Firm—Harness, Dickey & Pierce, P.L.C.

(57) ABSTRACT

The modulator includes an oscillator generating signals, each having a different phase, and a selector receiving digital data. When the digital data received by the selector changes logic state, the selector supplies a first and second plurality of signals generated by the oscillator to first and second non-linear amplifiers, respectively. An adder then adds the output of each amplifier to generate a radio frequency output.

17 Claims, 4 Drawing Sheets

METHOD AND APPARATUS FOR MODULATING DIGITAL DATA

BACKGROUND OF THE INVENTION

1. Field of the Invention

The present invention relates to an efficient digital transmission technique, and more particularly, a method and apparatus for modulating digital data.

2. Description of Related Art

Digital communication relies on numerous different, albeit related, forms of digital modulation such as phase shift keying (PSK), bi-phase shift keying (BPSK), quadrature phase shift keying (QPSK or 4-PSK), and quadrature amplitude modulation (QAM).

BPSK will be described with reference to FIG. 1. As shown, the magnitude of a reference carrier is constant, and to transmit either a 0 or a 1, the phase thereof is "keyed" or switched between 0° and 180°. A receiver then decides whether a 0 or a 1 was transmitted based on the phase of the received carrier, and generates the original data stream. With this simple scheme, one bit of information is transmitted with each state or symbol, so that the carrier phase is keyed at the data rate. FIG. 1 also illustrates the constellation for BPSK. As shown, the BPSK constellation diagram includes two points in the I-Q plane where I stands for in-phase (i.e., phase reference) and Q stands for quadrature (i.e., 90° out-of-phase). The two points in the BPSK constellation diagram represent the position of the signal at the "timing instance". The timing instance is when the receiver interprets the signal. The signal can only be at one position at a time, but the constellation can be thought of as having persistence so that all of proper the states appear. Constellation diagrams such as in FIG. 1 typically do not show the transition between states and it should be noted that this transition does take a finite time. But for clarity, the transitions are not shown otherwise traces connecting the two states would clutter the diagram.

FIG. 2 illustrates the constellation diagram for QPSK. As shown, four different states exist in the QPSK diagram at phase values of 45°, 135°, 225°, and 315°. As further shown, each state corresponds to a symbol representing two bits. Because the data is taken two bits at a time to form a symbol, the symbol rate is half the bit rate. As a result, QPSK requires half the band width of BPSK for the same bit rate.

Transmission of the modulated signal usually requires generating an amplified modulated signal. Unfortunately, amplification can introduce distortion, which alters the bandwidth of the signal. Many multiple access communication techniques, such as time division multiple access (TDMA), require maintaining transmitted signals within a narrow frequency band to increase capacity. For this reason, linear amplifiers have generally been used to amplify modulated signals when such multiple access communication techniques are employed. Linear amplifiers, while amplifying the modulated signal, also preserve the frequency of the signal, and give a better narrow band accuracy. By narrow band, it is meant that the frequency band of the carrier signal is larger than the frequency band of the signal.

Linear amplifiers, however, consume significant power. Power becomes an issue, particularly, in wireless communication systems where the individual mobile stations are powered by a limited power source. Accordingly, techniques that advantageously lengthen the life of such power sources are highly desirable.

SUMMARY OF THE INVENTION

The method and apparatus for modulating digital data according to the present invention uses non-linear amplifiers. Non-linear amplifiers, occasionally called switching or high frequency amplifiers and commonly known (but not limited to) as classes D, E, F, G and H, faithfully reproduce the phase of a signal, but not the envelope (in contrast to linear amplifiers). Non-linear amplifiers consume significantly less power than linear amplifiers, but because of the distortion they introduce, typically do not meet narrow frequency band requirements. However, the method and apparatus for modulating digital data according to the present invention, while using non-linear amplifiers, also meets narrow frequency band requirements.

The modulator includes an oscillator generating signals, each having a different phase. A selector, in the modulator, sends a first plurality of these signals to a first non-linear amplifier when the digital data received by the selector changes logic state (e.g., goes from 0 to 1 or from −1 to 1), and also sends a second plurality of the signals to a second non-linear amplifier when the digital data changes logic state. The outputs of the first and second non-linear amplifiers are summed to generate a radio frequency output that does not suffer from distortion typically introduced by non-linear amplifiers.

BRIEF DESCRIPTION OF THE DRAWINGS

The present invention will become more fully understood from the detailed description given below and the accompanying drawings which are given by way of illustration only, wherein like reference numerals designate corresponding parts in the various drawings, and wherein.

DETAILED DESCRIPTION OF THE PREFERRED EMBODIMENTS

Figure 3:
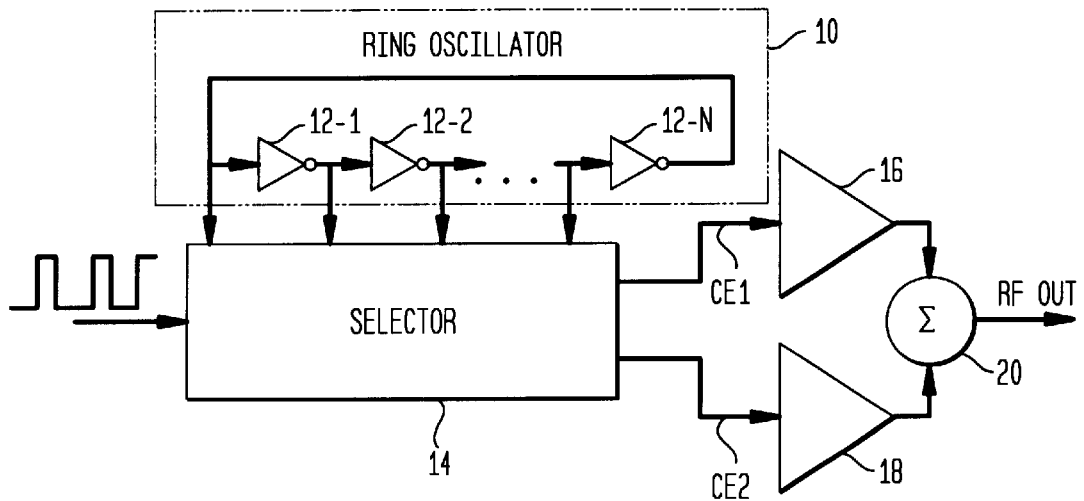
FIG. 3 illustrates a modulator according to the present invention for performing BPSK modulation.

FIG. 3 illustrates a modulator according to the present invention for performing BPSK modulation. As shown, a ring oscillator 10 includes first-Nth inverters 12-1 to 12-N connected in series, and the output of the Nth inverter 12-N is connected to the input of the first inverter 12-1. The first-Nth inverters 12-1 to 12-N resonate so that the output of each first-Nth inverter 12-1 to 12-N is a differently phased signal.

A selector 14 receives the digital data for modulation and the output from the ring oscillator 10. Based on the digital data, the selector 14 selectively applies the output from the ring oscillator 10 to a first non-linear power amplifier 16 and a second non-linear power amplifier 18. An adder 20 sums the output of the first and second non-linear power amplifiers 16 and 18 to generate the modulated signal at radio frequency RF for transmission.

The operation of the modulator illustrated in FIG. 1 will now be described in detail with reference to FIGS. 4A–5. The ring oscillator 10 generates multiple differently phased signals. One embodiment of these differently phased signals is illustrated in FIG. 5. FIG. 5 illustrates a coordinate plane with the horizontal axis as the real axis and the vertical axis as the imaginary axis. As represented by inner circle 30, each of the differently phased signals have the same magnitude A0. As represented by the crosses 32 on the inner circle 30, the oscillator 10 generates 16 differently phased signals (i.e., N=16) wherein the difference in phase between adjacent differently phased signals along the inner circle 30 is the same. Namely, the differently phased signals include signals having the phases 0, $\Pi/8$, $\Pi/4$, ..., $15\Pi/8$.

However, the differently phased signals are treated as a first and second plurality of differently phased signals by the selector 14. The differently phased signals having phases 0, $\Pi/8$, ..., $\Pi$ serve as the first plurality of differently phased signals, and the differently phased signals having phases 0, $15\Pi/8$, $7\Pi/4$, ..., $\Pi$ serve as the second plurality of differently phased signals.

Figure 4A:
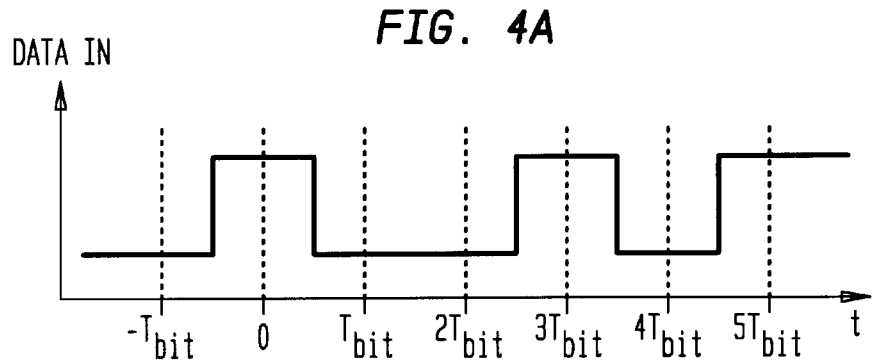
FIGS. 4A–4B illustrate the digital data received and the RF output of the modulator illustrated in FIG. 3.

Assume initially, as shown in FIG. 4A that the selector 14 receives digital data representing −1. At this point, the selector 14 selects the differently phased signal having phase $\Pi$ as both a first output signal CE1 and a second output signals CE2, and sends the first and second output signals CE1 and CE2 to the first and second non-linear amplifiers 16 and 18, respectively. The adder 20 adds the output of the first and second non-linear amplifiers 16 and 18 to produce the RF output signal illustrated in FIG. 4B.

When the digital data entering the selector 14 changes sign, the selector 14 is triggered to begin stepping around the ring oscillator 10, in opposing fashion, to generate the first and second output signals CE1 and CE2. Namely, the selector 14 supplies, in a stepwise manner, the first plurality of differently phased signals as the first output signal CE1 and second plurality of differently phased signals as the second output signal CE2. Accordingly, the first non-linear amplifier 16 receives the differently phased signals having phases $7\Pi/8$, $3\Pi/4$, ..., 0, and the second non-linear amplifier 18 receives the differently phased signals having phases $9\Pi/8$, $5\Pi/4$, ... 0.

FIG. 5 illustrates the phasors of the first and second output signals CE1 and CE2 when the differently phased signals having phases $3\Pi/4$ and $5\Pi/4$ are selected as the first and second output signals CE1 and CE2, respectively. Ignoring the amplification provided by the first and second non-linear amplifiers 16 and 18, the resulting phasor of the RF output is also illustrated in FIG. 5. As this example demonstrates, the trajectory of the phasor representing the RF output stays on the real axis. FIG. 5 further illustrates the projection of the phasor representing the RF output over time. As shown, the step transition of the digital data is smoothed over time. Furthermore, by adding the output of the first and second non-linear amplifiers 16 and 18, the distortion introduced by each respective amplifier is cancelled out (i.e., filtered out).

Figure 4B:
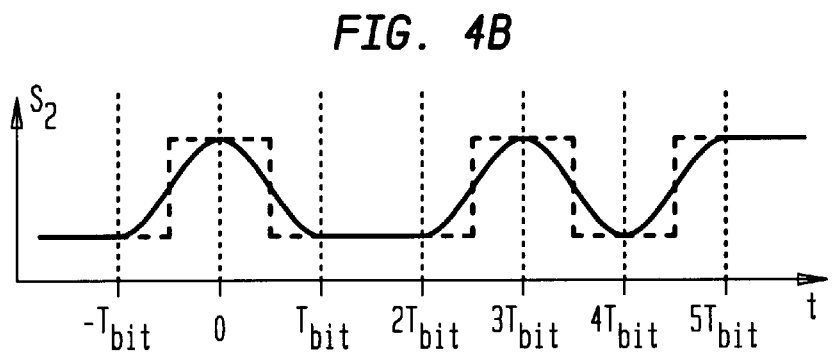
Figure 5:
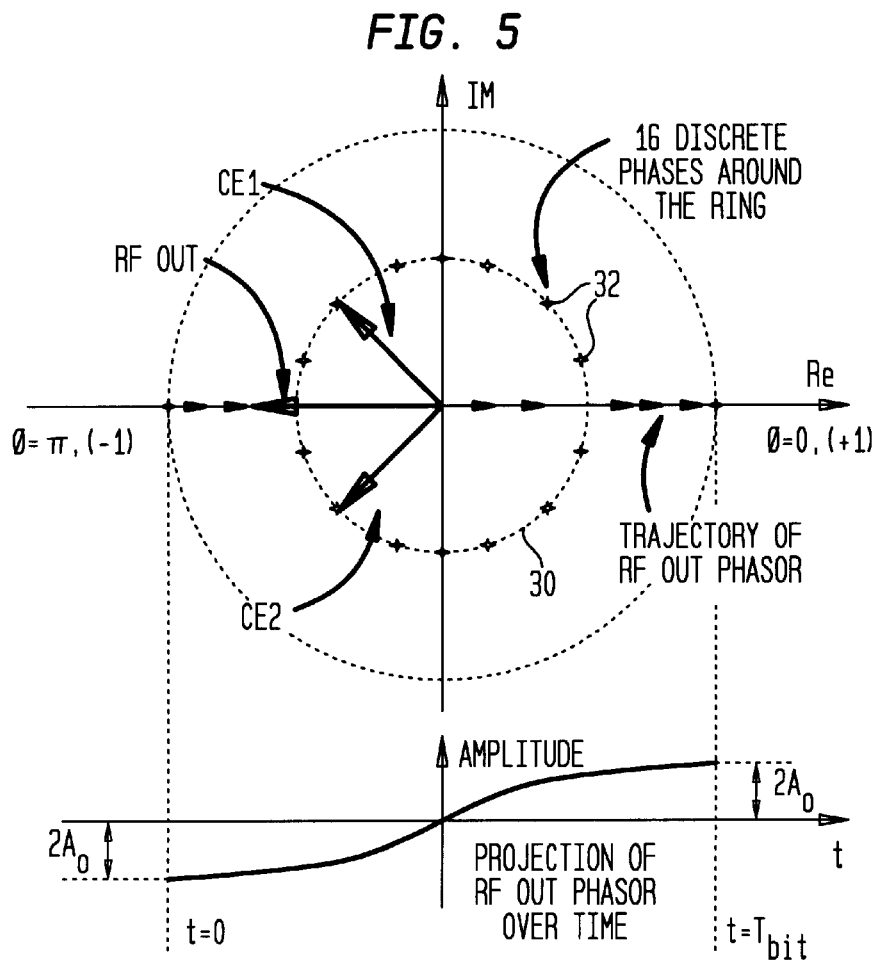
FIG. 5 illustrates the differently phased signals generated by the oscillator in the modulator of FIG. 3 and the RF output phasor trajectory.

When the digital data changes state again, the selector 14 supplies the first and second plurality of differently phased signals to the first and second non-linear amplifiers 16 and 18. But, this time, the differently phased signals progress from the signal with a phase of 0 to the signal with a phase of $\Pi$. FIG. 4B illustrates the RF output of the modulator over time with respect to the digital data illustrated in FIG. 4A.

Figure 1:
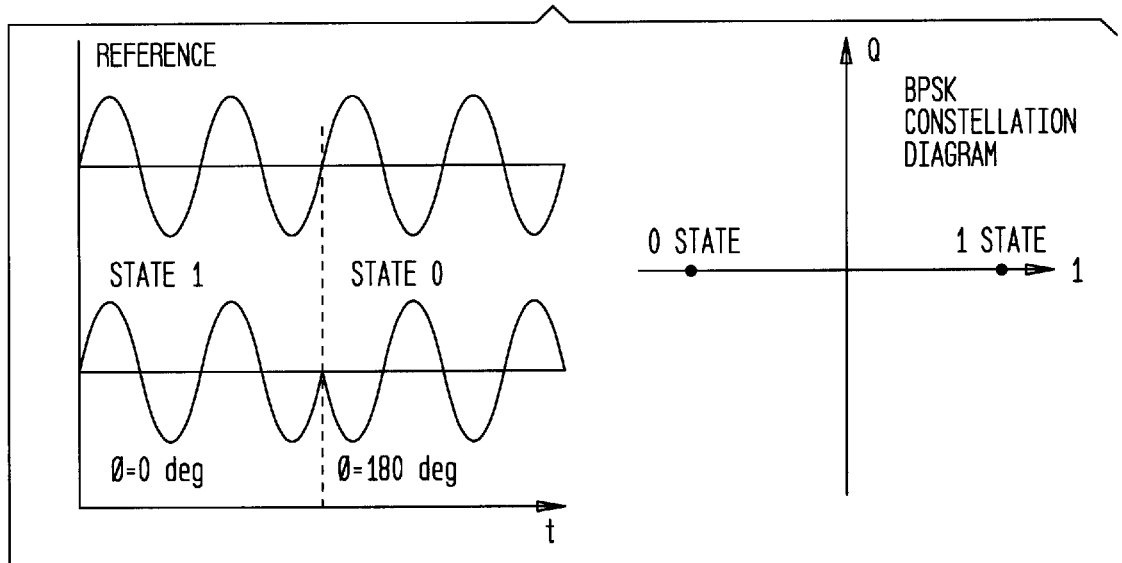
FIG. 1 illustrates the reference carrier, keyed reference carrier and constellation diagram for bi-phase shift keying.
Figure 2:
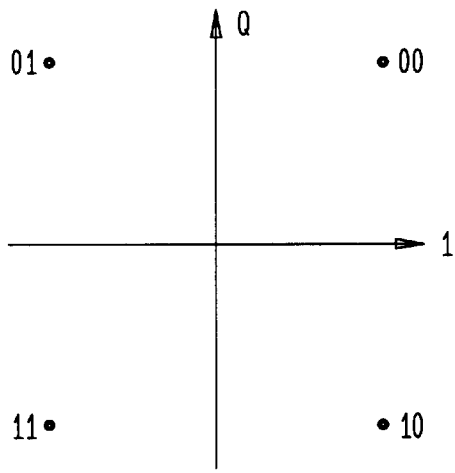
FIG. 2 illustrates the constellation diagram for quadrature phase shift keying.

While the ring oscillator 10 of the modulator illustrated in FIG. 1 was described as providing 16 differently phased signals, it should be understood that less than or greater than 16 differently phased signals could be supplied. Furthermore, instead of supplying differently phased signals, where adjacent differently phased signals differ in phase by the same phase amount, an intermediate processing circuit (not shown), such as interpolators, is disposed between the oscillator 10 and the selector 14 such that the selector 14 receives differently phased signals where adjacent differently phased signals differ in phase by different amounts. This allows the designer of the modulator to implement any desired method of filtering the digital data prior to transmission.

Figure 6:
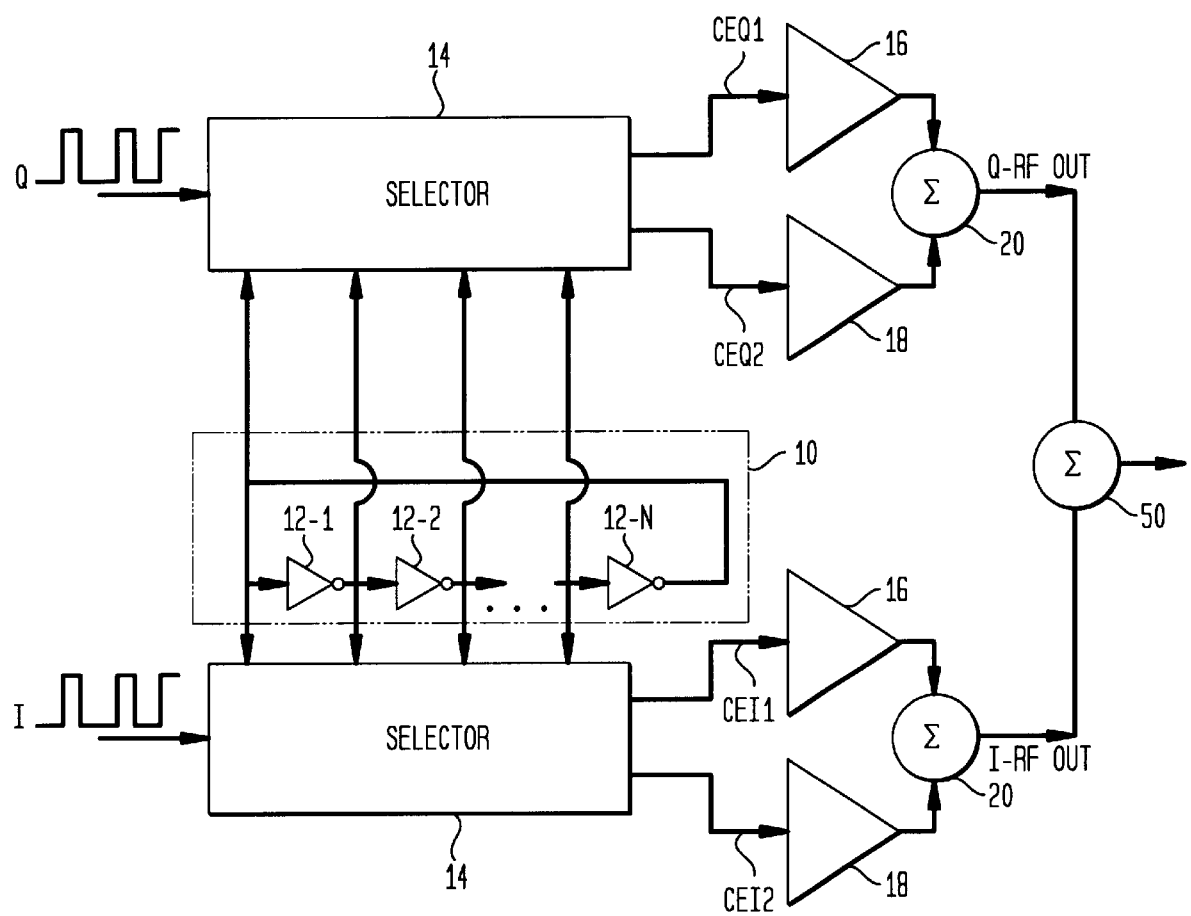
FIG. 6 illustrates a modulator according to the present invention for performing QPSK modulation.

As discussed above, the modulator of FIG. 1 applies to BPSK. However, based on the forgoing and following disclosure, it will be understood how to use the circuit of FIG. 1 as a basic building block to provide circuits for other modulation techniques, such as QPSK. FIG. 6 illustrates an example of a modulator for QPSK according to the present invention. As shown, the in-phase digital data signal and quadrature-phase digital data signal are each supplied to the same circuit of FIG. 1, albiet with the oscillator 10 being shared.

Figure 7:
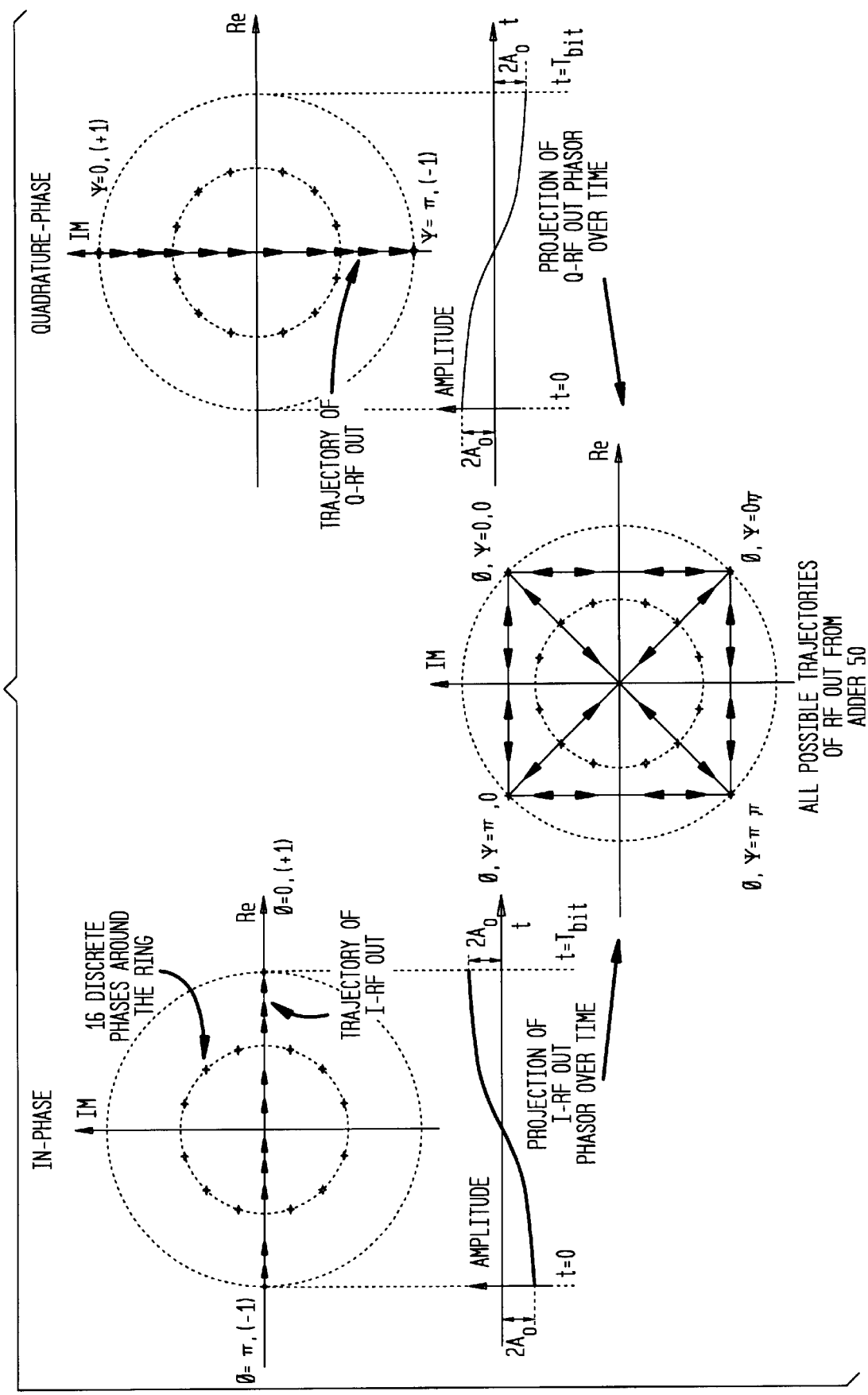
FIG. 7 illustrates the differently phased signals generated by the oscillator in the modulator of FIG. 6 and the phasor trajectories of the output from the in-phase modulator circuit, the output from the quadrature-phase modulator circuit, and the RF output.

The only operational differences are (1) the selector 14 for the quadature-phase digital data supplies the differently phased signals between $\Pi/2$ and $3\Pi/2$ as the first and second plurality of differently phased signals, and (2) the output of the adders 20 are added by another adder 50 to produce the output of the QPSK modulator. FIG. 7 illustrates the phase diagrams and possible phasor trajectories of the I-RF output from the adder 20 for the in-phase digital data, the Q-RF output from the adder 20 for the quadrature-phase digital data, and the RF output of the adder 50.

As with the modulator of FIG. 1, the number of differently phased signals generated by the oscillator 10 is not limited to 16, and the differently phased signals are not limited to having adjacent differently phased signals differ by a same amount. In the later case, another oscillator for the quadrature-phase digital data circuit might be needed, depending on the filter technique employed, and processing circuits are disposed between the selectors 14 and the oscillators 10.

As demonstrated above, modulators according to the present invention provide the low power consumption benefits of using non-linear amplifiers and satisfy the narrow frequency band requirements typically demanding the use of linear amplifiers.

What is claimed is:
1. A method of modulating digital data, comprising:
   a) providing first and second plurality of differently phased signals, said first and second plurality of differently phased signals both include first and second reference phase signals, said first plurality of differently phased signals differ from said first reference phase signal to said second reference phase signal by a respective first plurality of differing amounts, said second plurality of differently phased signals differ from said first reference phase signal to said second reference phase signal by a respective second plurality of differing amounts, and said first plurality of differing amounts are respectively equal in magnitude and opposite in sign from said second plurality of differing amounts;

b) receiving digital data;

c) applying said first and second plurality of differently phased signals to first and second non-linear amplifiers, respectively, when said received digital data changes state; and d) summing output from said first and second non-linear amplifiers.

2. The method of claim 1, wherein said first plurality of differing amounts are incrementally different from said first reference phase signal by a same negative increment, and said second plurality of differing amounts are incrementally different from said first reference phase signal by positive increment equal in magnitude to said negative increment.

3. The method of claim 2, wherein said first reference phase signal and said second reference phase signal differ in phase by 180 degrees.

4. The method of claim 3, wherein said step c) applies said first and second plurality of differently phased signals from said first reference phase signal to said second reference phase signal when said received digital data transitions from a first state to a second state, and applies said first and second plurality of differently phased signals from said second reference phase signal to said first reference phase signal when said received digital data transitions from said second state to said first state.

5. The method of claim 2, wherein said step c) applies said first and second plurality of differently phased signals from said first reference phase signal to said second reference phase signal when said received digital data transitions from a first state to a second state, and applies said first and second plurality of differently phased signals from said second reference phase signal to said first reference phase signal when said received digital data transitions from said second state to said first state.

6. The method of claim 1, wherein said first reference phase signal and said second reference phase signal differ in phase by 180 degrees.

7. The method of claim 6, wherein said step c) applies said first and second plurality of differently phased signals from said first reference phase signal to said second reference phase signal when said received digital data transitions from a first state to a second state, and applies said first and second plurality of differently phased signals from said second reference phase signal to said first reference phase signal when said received digital data transitions from said second state to said first state.

8. The method of claim 1, wherein said step c) applies said first and second plurality of differently phased signals from said first reference phase signal to said second reference phase signal when said received digital data transitions from a first state to a second state, and applies said first and second plurality of differently phased signals from said second reference phase signal to said first reference phase signal when said received digital data transitions from said second state to said first state.

9. An apparatus for modulating digital data, comprising:

a first non-linear amplifier;

a second non-linear amplifier;

an oscillating circuit generating first and second plurality of differently phased signals, wherein said first and second plurality of differently phased signals both include first and second reference phase signals, said first plurality of differently phased signals differ from said first reference phase signal to said second reference phase signal by a respective first plurality of differing amounts, said second plurality of differently phased signals differ from said first reference phase signal to said second reference phase signal by a respective second plurality of differing amounts, and said first plurality of differing amounts are respectively equal in magnitude and opposite in sign from said second plurality of differing amounts;

a selecting circuit receiving digital data, and applying said first and second plurality of differently phased signals to said first and second non-linear amplifiers, respectively, when said received digital data changes state; and an adder adding output from said first and second non-linear amplifiers.

10. The apparatus of claim 9, wherein said first plurality of differing amounts are incrementally different from said first reference phase signal by a same negative increment, and said second plurality of differing amounts are incrementally different from said first reference phase signal by positive increment equal in magnitude to said negative increment.

11. The apparatus of claim 10, wherein said first reference phase signal and said second reference phase signal differ in phase by 180 degrees.

12. The apparatus of claim 11, wherein said selecting circuit applies said first and second plurality of differently phased signals from said first reference phase signal to said second reference phase signal when said received digital data transitions from a first state to a second state, and applies said first and second plurality of differently phased signals from said second reference phase signal to said first reference phase signal when said received digital data transitions from said second state to said first state.

13. The apparatus of claim 10, wherein said selecting circuit applies said first and second plurality of differently phased signals from said first reference phase signal to said second reference phase signal when said received digital data transitions from a first state to a second state, and applies said first and second plurality of differently phased signals from said second reference phase signal to said first reference phase signal when said received digital data transitions from said second state to said first state.

14. The apparatus of claim 9, wherein said first reference phase signal and said second reference phase signal differ in phase by 180 degrees.

15. The apparatus of claim 14, wherein said selecting circuit applies said first and second plurality of differently phased signals from said first reference phase signal to said second reference phase signal when said received digital data transitions from a first state to a second state, and applies said first and second plurality of differently phased signals from said second reference phase signal to said first reference phase signal when said received digital data transitions from said second state to said first state.

16. The apparatus of claim 9, wherein said selecting circuit applies said first and second plurality of differently phased signals from said first reference phase signal to said second reference phase signal when said received digital data transitions from a first state to a second state, and applies said first and second plurality of differently phased signals from said second reference phase signal to said first reference phase signal when said received digital data transitions from said second state to said first state.

17. The apparatus of claim 9, wherein said oscillating circuit is a ring oscillator.

* * * * *